US011948855B1

(12) United States Patent
Simon et al.

(10) Patent No.: US 11,948,855 B1
(45) Date of Patent: Apr. 2, 2024

(54) INTEGRATED CIRCUIT (IC) PACKAGE WITH CANTILEVER MULTI-CHIP MODULE (MCM) HEAT SPREADER

(71) Applicant: Rockwell Collins, Inc., Cedar Rapids, IA (US)

(72) Inventors: Bret W. Simon, West Liberty, IA (US); Jacob R. Mauermann, Marion, IA (US); Mark T. Dimke, Cedar Rapids, IA (US); Kaitlyn M. Fisher, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 17/736,002

(22) Filed: May 3, 2022

Related U.S. Application Data

(62) Division of application No. 16/586,252, filed on Sep. 27, 2019, now abandoned.

(51) Int. Cl.
| | |
|---|---|
| *H01L 23/367* | (2006.01) |
| *H01L 23/31* | (2006.01) |
| *H01L 23/42* | (2006.01) |
| *H01L 25/065* | (2023.01) |

(52) U.S. Cl.
CPC ........ *H01L 23/367* (2013.01); *H01L 23/3128* (2013.01); *H01L 23/3675* (2013.01); *H01L 23/42* (2013.01); *H01L 25/0655* (2013.01)

(58) Field of Classification Search
CPC . H01L 23/367; H01L 23/3672; H01L 25/042; H01L 25/072; H01L 25/0655; H01L 25/0753; H01L 25/115; H01L 23/3675
See application file for complete search history.

(56) References Cited

U.S. PATENT DOCUMENTS

| | | | |
|---|---|---|---|
| 4,698,663 A | 10/1987 | Sugimoto et al. | |
| 5,041,902 A * | 8/1991 | McShane | H01L 23/367 |
| | | | 257/E23.047 |
| 5,367,193 A | 11/1994 | Malladi | |
| 5,444,909 A * | 8/1995 | Mehr | H01L 21/565 |
| | | | 257/796 |
| 5,548,482 A * | 8/1996 | Hatauchi | H01L 23/4093 |
| | | | 257/713 |
| 5,883,430 A | 3/1999 | Johnson | |
| 5,909,056 A | 6/1999 | Mertol | |
| 6,046,077 A | 4/2000 | Baba | |
| 6,104,093 A | 8/2000 | Caletka et al. | |
| 6,146,921 A | 11/2000 | Barrow | |
| 6,351,032 B1 | 2/2002 | Lee et al. | |

(Continued)

*Primary Examiner* — David A Zarneke
(74) *Attorney, Agent, or Firm* — Suiter Swantz pc llo

(57) ABSTRACT

An integrated circuit (IC) package comprises a substrate having an outer portion close to the perimeter of the substrate, an inner portion surrounded by the outer portion, and an upper surface incorporating a wiring layer for the bonding of a semiconducting die (e.g., via its bottom face). The IC package includes a metallic or otherwise thermally conductive heat spreader thermally bonded on an inner surface of a boss on its bottom side to the top surface of the semiconducting die, and extending on its top surface to the edges of the substrate to maximize heat dissipation from the die. The boss extends toward the semiconducting die and is thermally coupled to the top face of the semiconducting die.

7 Claims, 5 Drawing Sheets

(56) References Cited

U.S. PATENT DOCUMENTS

| | | |
|---|---|---|
| 6,410,988 B1 | 6/2002 | Caletka et al. |
| 6,486,562 B1 | 11/2002 | Kato |
| 6,507,116 B1 | 1/2003 | Caletka et al. |
| 6,590,292 B1 | 7/2003 | Barber et al. |
| 6,607,942 B1 | 8/2003 | Tsao et al. |
| 6,665,187 B1 | 12/2003 | Alcoe et al. |
| 6,720,650 B2 | 4/2004 | Miyazaki |
| 6,724,080 B1 | 4/2004 | Ooi et al. |
| 6,844,622 B2 | 1/2005 | Huang et al. |
| 6,931,141 B2 | 8/2005 | Moller |
| 6,979,899 B2 | 12/2005 | Edwards |
| 7,034,387 B2 * | 4/2006 | Karnezos ............ H01L 23/3135 361/764 |
| 7,057,277 B2 | 6/2006 | Chen et al. |
| 7,074,645 B2 | 7/2006 | Huang et al. |
| 7,151,308 B2 | 12/2006 | Tao et al. |
| 7,153,725 B2 | 12/2006 | Wang et al. |
| 7,250,676 B2 * | 7/2007 | Wang .................. H01L 25/105 257/E25.023 |
| 7,268,427 B2 | 9/2007 | Anzai |
| 7,304,372 B2 | 12/2007 | Hu et al. |
| 7,306,973 B2 * | 12/2007 | Karnezos ................ H01L 25/03 257/784 |
| 7,517,729 B2 | 4/2009 | Lee et al. |
| 7,728,440 B2 | 6/2010 | Honda |
| 7,851,906 B2 | 12/2010 | Alcoe et al. |
| 7,859,101 B2 | 12/2010 | Zhao et al. |
| 8,013,438 B2 | 9/2011 | Luan et al. |
| 8,077,466 B2 | 12/2011 | Mizunashi |
| 8,247,900 B2 | 8/2012 | Yuan |
| 8,258,016 B2 | 9/2012 | Ito et al. |
| 8,334,591 B2 | 12/2012 | Kusano |
| 8,367,469 B2 | 2/2013 | Bonthron et al. |
| 8,410,598 B2 | 4/2013 | Goh |
| 8,558,372 B2 * | 10/2013 | Negoro ............... H01L 25/0655 257/706 |
| 8,859,342 B2 | 10/2014 | Kim et al. |
| 8,901,732 B2 | 12/2014 | Yew et al. |
| 8,901,748 B2 | 12/2014 | Manusharow et al. |
| 8,922,024 B2 | 12/2014 | Na et al. |
| 9,000,581 B2 | 4/2015 | Chen et al. |
| 9,006,889 B2 | 4/2015 | Joshi |
| 9,029,202 B2 | 5/2015 | Yap et al. |
| 9,054,228 B2 | 6/2015 | Choi et al. |
| 9,059,174 B2 * | 6/2015 | Ding ................... H01L 23/5256 |
| 9,076,754 B2 | 7/2015 | Hung et al. |
| 9,089,051 B2 | 7/2015 | Li et al. |
| 9,093,415 B2 | 7/2015 | Kim et al. |
| 9,111,878 B2 | 8/2015 | Higgins, III et al. |
| 9,142,523 B2 | 9/2015 | Liu et al. |
| 9,236,323 B2 * | 1/2016 | Kourakata ............. H01L 21/52 |
| 9,330,999 B2 | 5/2016 | Fitzgerald et al. |
| 9,418,954 B2 | 8/2016 | Bar et al. |
| 9,478,476 B2 | 10/2016 | Mallik et al. |
| 9,536,805 B2 | 1/2017 | Fazelpour et al. |
| 9,583,415 B2 * | 2/2017 | Yu ........................... H01L 23/36 |
| 9,831,190 B2 | 11/2017 | Yew et al. |
| 9,842,813 B2 | 12/2017 | Jiang et al. |
| 9,865,566 B1 | 1/2018 | Yu et al. |
| 9,892,990 B1 | 2/2018 | Galloway et al. |
| 9,916,145 B2 * | 3/2018 | Xu ........................... G06F 8/447 |
| 9,941,186 B2 | 4/2018 | Chen et al. |
| 9,941,251 B2 * | 4/2018 | Hung .................... H01L 24/16 |
| 9,960,145 B2 | 5/2018 | Costa et al. |
| 10,085,352 B2 | 9/2018 | Costa et al. |
| 10,163,754 B2 | 12/2018 | Ho et al. |
| 10,269,682 B2 | 4/2019 | Hsieh et al. |
| 10,486,963 B2 * | 11/2019 | Hatcher, Jr. ........... B81C 1/00801 |
| 10,486,965 B2 * | 11/2019 | Vandemeer ......... H01L 23/3135 |
| 10,490,521 B2 | 11/2019 | Hu et al. |
| 10,529,645 B2 | 1/2020 | Gandhi et al. |
| 10,580,717 B2 * | 3/2020 | Liu ..................... H01L 21/4882 |
| 10,672,719 B2 | 6/2020 | Hur et al. |
| 10,804,172 B2 | 10/2020 | Fang |
| 10,811,345 B2 | 10/2020 | Muto et al. |
| 11,056,414 B2 * | 7/2021 | Jang .................. H01L 23/49827 |
| 11,069,590 B2 * | 7/2021 | Hammond ............. B81B 7/007 |
| 11,264,300 B2 * | 3/2022 | Jeng ................... H01L 23/3128 |
| 11,538,728 B2 * | 12/2022 | Fujino .................... H01L 21/56 |
| 2003/0160319 A1 | 8/2003 | Zheng et al. |
| 2004/0099944 A1 | 5/2004 | Kimura |
| 2005/0139994 A1 | 6/2005 | Hsu et al. |
| 2013/0119530 A1 | 5/2013 | Liu et al. |
| 2014/0151870 A1 | 6/2014 | Kim |
| 2015/0173243 A1 | 6/2015 | Chauhan et al. |
| 2016/0372398 A1 * | 12/2016 | Kourakata .......... H01L 25/0655 |
| 2018/0122777 A1 | 5/2018 | Wong et al. |
| 2020/0091029 A1 | 3/2020 | Jeng et al. |

* cited by examiner

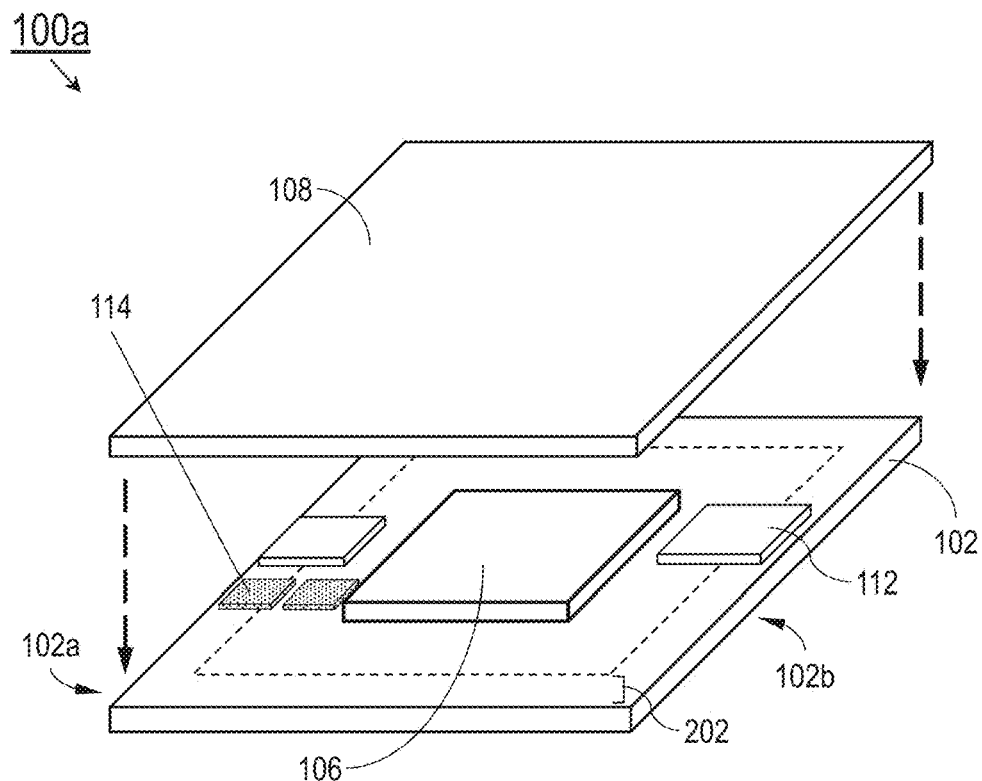
FIG. 2A
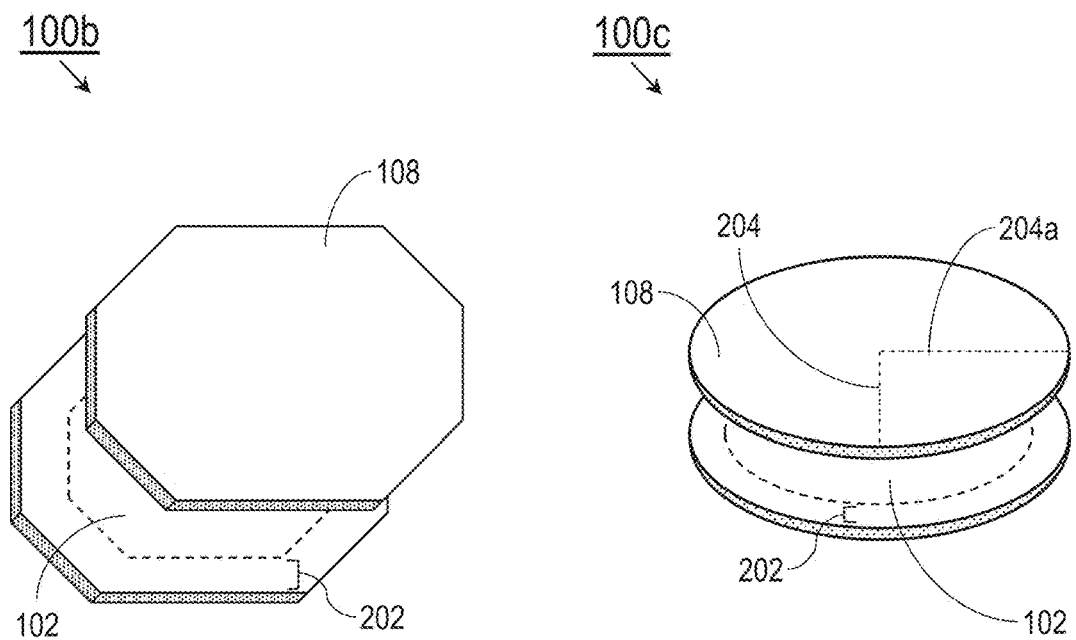
FIG. 2B  FIG. 2C

INTEGRATED CIRCUIT (IC) PACKAGE WITH CANTILEVER MULTI-CHIP MODULE (MCM) HEAT SPREADER

CROSS-REFERENCE TO RELATED APPLICATIONS

The present application claims the benefit of priority under 35 U.S.C. § 121 as a divisional application of U.S. patent application Ser. No. 16/586,252 filed Sep. 27, 2019 and entitled INTEGRATED CIRCUIT (IC) PACKAGE WITH CANTILEVER MULTI-CHIP MODULE (MCM) HEAT SPREADER. Said U.S. patent application Ser. No. 16/586,252 is herein incorporated by reference in its entirety.

GOVERNMENT SUPPORT

This technology was developed with U.S. government support under Definitive Contract N61340-17-C-0014, awarded by the Naval Air Warfare Center (DOD—Navy—NAVAIR). The U.S. government has certain rights in this invention.

BACKGROUND

Metal-lidded ball grid array (BGA) integrated circuit (IC) packages incorporate a block of semiconducting material, or die, on which functional circuitry is fabricated. IC packages incorporate a metallic lid, or heat spreader, in contact with the die for the dissipation of heat throughout the surface area of the lid. However, conventional designs require a step-down for bonding the perimeter of the lid to the substrate to which the die and other package components are bonded. This step-down requires a keep-out region around the entire perimeter of the substrate, reducing the available area for bonding or embedding of other package components.

SUMMARY

An integrated circuit (IC) package is disclosed. In embodiments, the IC package comprises a substrate having an outer portion close to the perimeter of the substrate, an inner portion surrounded by the outer portion, and an upper surface incorporating a wiring layer for the bonding of a semiconducting die (e.g., via its bottom face). The IC package includes a metallic or otherwise thermally conductive heat spreader thermally bonded on an inner surface of a boss on its bottom side to the top surface of the semiconducting die, and extending on its top surface to the edges of the substrate to maximize heat dissipation from the die. The boss extending toward the semiconducting die and thermally coupled to the top face of the semiconducting die.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

FIGS. 2A through 2C are diagrammatic isometric views of the IC package of FIG. 1 respectively incorporating polygonal and elliptical shapes;

DETAILED DESCRIPTION

Figure 1:
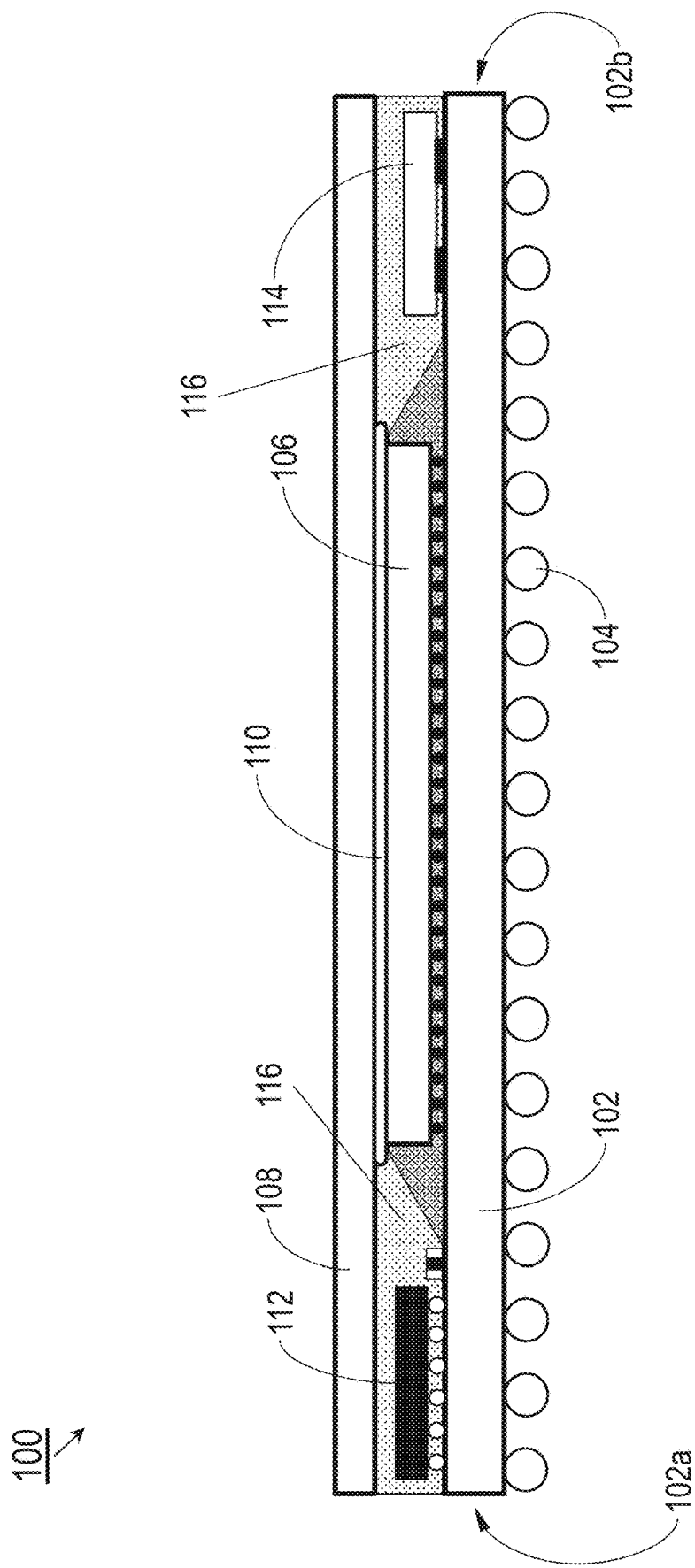
FIG. 1 is a diagrammatic profile view illustrating an integrated circuit (IC) package in accordance with example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Referring to FIG. 1, an integrated circuit (IC) package 100 is disclosed. In embodiments, the IC package 100 may incorporate a substrate 102 with a ball grid array 104 (BGA) for mounting, a semiconducting die 106, and a cantilevered heat spreader 108.

In embodiments, the substrate 102 may incorporate a wiring layer on its upper surface via which the die 106 may be bonded thereto via its lower surface. The heat spreader 108 may be a metallic or otherwise thermally conductive lid that, rather than bonding down to the perimeter of the substrate 102, bonds directly to the back (e.g., upper) side of the die 106 via a thermally conductive adhesive 110 (e.g., thermal interface material (TIM1) or any other appropriate bonding material). Accordingly, the outer portion of the substrate 102 (e.g., proximate to the edges 102a-b of the substrate, and surrounding the inner portion of the substrate to which the die 106 is bonded) may accommodate additional auxiliary components 112, 114 (e.g., additional circuitry, capacitors or other circuit components, additional memory or processing units, wire bonded devices) bonded to the substrate (e.g., via the wiring layer, in a face-up or face-down configuration), eliminating the "keep-out" region adjacent to the perimeter where the lid would ordinarily be bonded.

In embodiments, the heat spreader 108 is supported by an encapsulant 116 (e.g., silica-filled epoxy, anhydride resin, or any appropriate molding compound) injected into the space between the substrate 102 and the heat spreader, e.g., by the force of gravity, vacuum assistance or mechanical pressure. The encapsulant 116 may fill any remaining free space between the substrate 102 and the heat spreader 108, supporting the heat spreader and protecting any additional auxiliary components 112, 114 bonded to the outer portion of the substrate.

Referring to FIG. 2A, the IC package 100a may be implemented and may function similarly to the IC package 100 of FIG. 1, except that the IC package 100a may allow for the mounting of additional auxiliary components 112, 114 nearly to the edge of the substrate 102.

In embodiments, the elimination of the "keep-out region" via which the conductive lid of the IC package would be bonded to the substrate 102 may allow for the placement of auxiliary components 112, 114 partially or fully within this region. For example, the former "keep-out region" may correspond to an outer portion 202 of the substrate 102 adjacent to the edges 102a-b thereof, and extending inward from the edges for up to 10 percent (0.1) of the total dimensions of the substrate 102 (e.g., for a substantially square substrate 102 having a width of 50-60 mm, the outer portion 202 would extend approximately 5-6 mm inward from each edge 102a-b of the substrate.

In embodiments, the elimination of the "keep-out region" in favor of the free outer portion 202 may allow the heat spreader 108 to extend to at least the edges 102a-b of the substrate 102, such that the surface area of the heat spreader is maximized (e.g., substantially equivalent to that of the substrate), optimizing the ability of the heat spreader to horizontally dissipate heat from the die 106.

In embodiments, the IC package 100a may have a substantially rectangular or square shape (e.g., the shapes of the upper and lower surfaces of the substrate 102 and the heat spreader 108 may include squares, rectangles, or rounded rectangular shapes). Referring in particular to FIGS. 2B and 2C, the IC packages 100b and 100c may be implemented and may function similarly to the IC package 100a of FIG. 2A, except that the IC package 100b may incorporate a substrate 102 and heat spreader 108 having a substantially polygonal shape (e.g., triangles, pentagons, hexagons, octagons, other non-quadrilateral polygons, and rounded versions thereof), the outer portion 202 similarly extending inward from the edges of the substrate 102. Similarly, referring in particular to FIG. 2C, in some embodiments the IC package 100c may incorporate a substrate 102 and heat spreader 108 having a substantially circular or elliptical shape defined by a radius 204. For example, a circular or substantially circular substrate 102 and heat spreader 108 may have a single radius 204 and a circumference corresponding to the perimeter, while an elliptical substrate and heat spreader 108 may have a radius 204 corresponding to a minor axis and a radius 204a corresponding to a major axis. In embodiments, the outer portion 202 of the substrate 102 may extend inward from the circumference of the substrate, e.g., for up to 10 percent (0.1) of the radius/radii 204, 204a.

Figure 3:
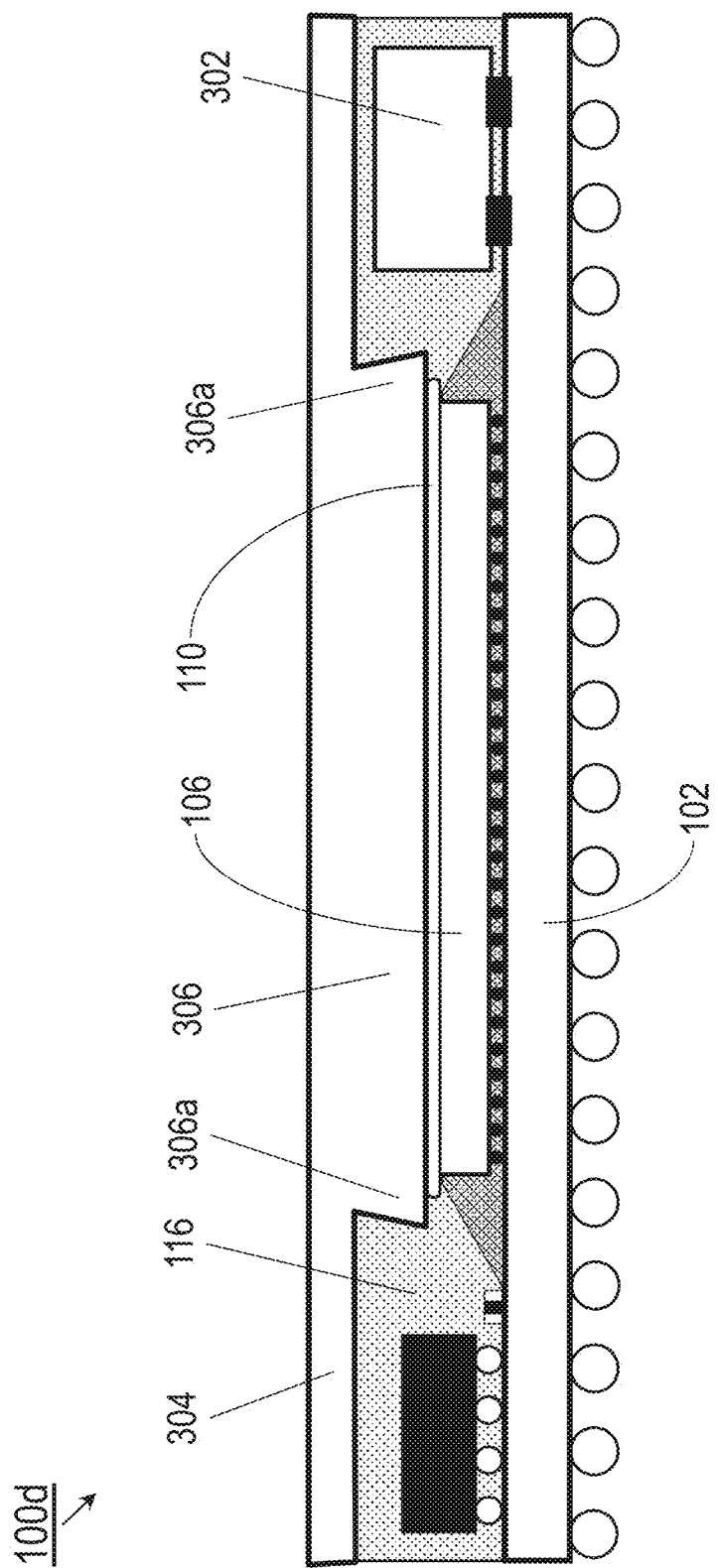
FIG. 3 is a diagrammatic profile view illustrating an IC package in accordance with example embodiments of this disclosure.

Referring now to FIG. 3, the IC package 100d may be implemented and may function similarly to the IC packages 100, 100a-c of FIGS. 1 through 2C, except that the IC package 100b may incorporate one or more tall components 302.

In embodiments, each tall component 302 may have a height (e.g., above the substrate 102 when bonded or otherwise mounted thereto) greater than the height of the die 106 when bonded to the substrate. Accordingly, the IC package 100d may include a heat spreader 304 incorporating a boss 306 extending from the heat spreader toward the upper face of the die 106. For example, the heat spreader 304 and boss 306 may comprise a single piece of like metallic or otherwise thermally conductive material (e.g., graphite, metal matrix or like composites), the boss bonded to the upper surface of the die 106 by the thermally conductive adhesive 110 (e.g., prior to the injection of the encapsulant 116).

In some embodiments, the boss 306 may be undercut, expanding slightly (306a) as it extends from the heat spreader 304 toward the die 106 to secure the heat spreader 304 from delamination or peeling away from the encapsulant 116.

Figure 4:
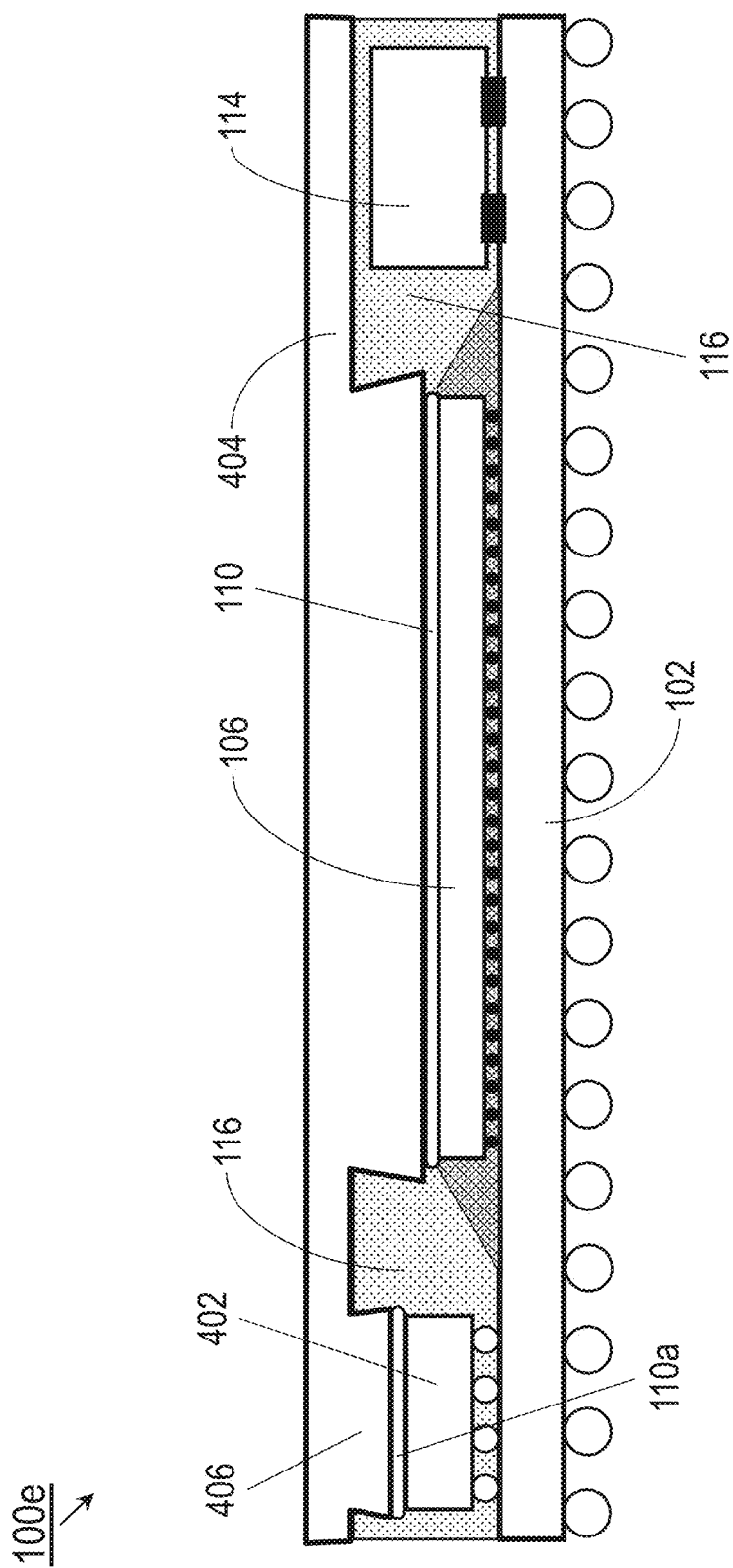
FIGS. 4 and 5 are diagrammatic profile views illustrating implementations of the IC package of FIG. 3.

Referring now to FIG. 4, the IC package 100e may be implemented and may function similarly to the IC package 100d of FIG. 3, except that the IC package 100e may incorporate one or more secondary semiconducting dies 402 and a heat spreader 404.

In embodiments, the use of encapsulant 116 to fill the gaps between the substrate 102 and the heat spreader 404 (rather than conventional sealed perimeter bonding of the heat spreader to the substrate) may enable the integration of sensitive auxiliary components 114 and connectors (e.g., wire bonds, printed interconnects, bare dies in face-up or face-down configurations) covered and protected by the encapsulant. Accordingly, the heat spreader 404 may incorporate, in addition to a primary boss 306 thermally bonded (110) to the primary die 106, secondary bosses 406 extending from the heat spreader toward, and thermally bonded (110a) to, the secondary dies 402 to dissipate any heat therefrom via the heat spreader.

Figure 5:
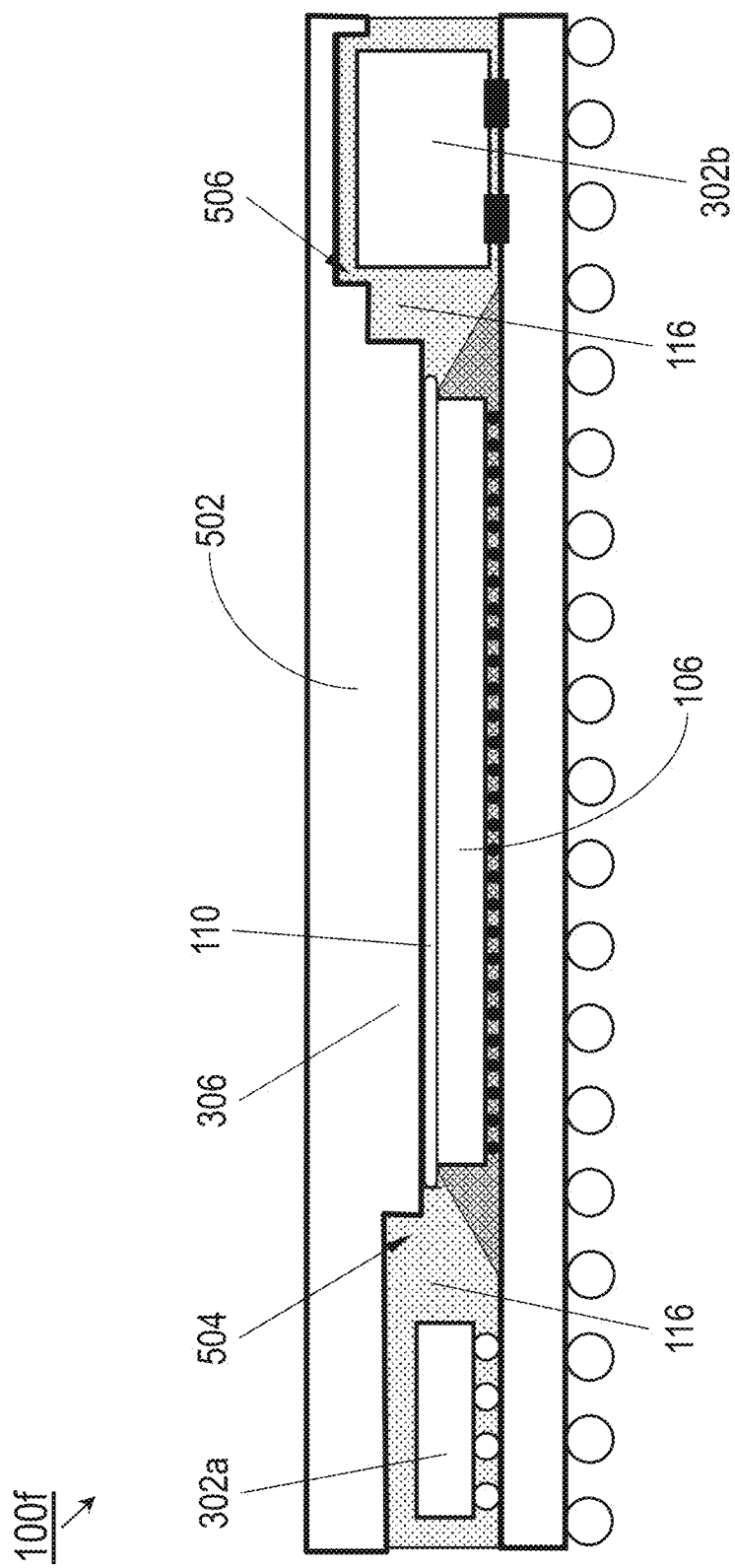

Referring now to FIG. 5, the IC package 100f may be implemented and may function similarly to the IC packages 100d-e of FIGS. 3 and 4, except that the IC package 100f may incorporate a heat spreader 502 that is "skylined", i.e., cut or shaped to accommodate a variety of tall components 302a-b. In embodiments, the tall components 302a-b may be implemented and may function similar to other auxiliary components (112, FIG. 1; 114, FIG. 4) or tall components (302, FIG. 3) but may not be directly or thermally bonded to the heat spreader 502. Accordingly, while the heat spreader 502 may incorporate a primary boss 306 extending from the heat spreader and thermally bonded (110) to the die 106, the heat spreader may otherwise incorporate various indentations 504, 506 in order to accommodate the various heights of the tall components 302*a-b* while allowing for the encapsulant 116 to surround and protect the tall components.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

We claim:

1. An integrated circuit (IC) package, comprising:
   at least one substrate having an upper surface and a lower surface, the upper surface and a lower surface sharing a perimeter defined by one or more edges and comprising an outer portion proximate to the perimeter and an inner portion surrounding the outer portion, the upper surface including at least one wiring layer;
   at least one semiconducting die comprising 1) a bottom face bonded to the inner portion of the substrate via the wiring layer and 2) a top face disposed at a first height above the substrate;
   one or more auxiliary components at least partially bonded to the outer portion of the substrate and including at least one tall component having a second height greater than the first height;
   a heat spreader disposed above the top face of the at least one tall component and extending in a plane between the one or more edges of the substrate, the heat spreader having an outer side and an inner side, the inner side comprising a boss extending toward the semiconducting die and thermally coupled to the top face, the boss having a first width adjacent to the heat spreader and a second width at the point of thermal coupling to the top face, the second width greater than the first width;
   and
   an encapsulant configured to fill the free space between the substrate and the heat spreader.

2. The IC package of claim 1, wherein the semiconducting die is a primary semiconducting die, and the one or more auxiliary components include at least one secondary semiconducting die.

3. The IC package of claim 2, wherein the boss is a first boss, and the heat spreader further comprises at least one second boss extending toward the secondary semiconducting die and thermally coupled thereto.

4. The IC package of claim 1, wherein the heat spreader further comprises at least one indentation set thereinto, the indentation corresponding to but not directly coupled to the tall component.

5. The IC package of claim 1, wherein:
   the upper surface and the lower surface have a polygonal shape;
   the one or more edges include at least two opposing edges separated by a width;
   and
   the outer portion of the substrate extends inward from the perimeter for a distance of not more than 10 percent of the width.

6. The IC package of claim 1, wherein:
   the upper surface and the lower surface have an elliptical shape;
   the perimeter is associated with a circumference and at least one radius;
   and
   the outer portion of the substrate extends inward from the perimeter for a distance of not more than 10 percent of the at least one radius.

7. The IC package of claim 1, wherein:
   the boss is undercut such that a shape of the boss expands as it extends from the heat spreader toward the at least one semiconducting die.

\* \* \* \* \*